United States Patent [19]

Erlam et al.

[11] Patent Number: 4,509,810
[45] Date of Patent: Apr. 9, 1985

[54] RACK WITH CARD FRAMES ADJUSTABLE ON LATERAL SLIDE GUIDES

[75] Inventors: David P. Erlam; Arthur E. Carr, both of Winchester, England

[73] Assignee: Rittal-Werk Rudolf Loh GmbH & Co. KG, Fed. Rep. of Germany

[21] Appl. No.: 486,991

[22] Filed: Apr. 21, 1983

[30] Foreign Application Priority Data

Apr. 21, 1982 [GB] United Kingdom ............... 8211566
Apr. 13, 1983 [GB] United Kingdom ............... 8310016

[51] Int. Cl.³ .......................... H05K 7/14; H05K 7/16
[52] U.S. Cl. ................................. 339/17 M; 339/66 M; 361/391; 361/415
[58] Field of Search ............... 339/17 M, 65, 17 LM, 339/66 R, 66 M; 361/380, 390, 391, 397, 399, 412, 413, 415

[56] References Cited

U.S. PATENT DOCUMENTS

| | | | |
|---|---|---|---|
| 2,337,159 | 12/1943 | Friedl, Jr. | 361/391 X |
| 2,789,024 | 4/1957 | Heisler | 361/391 X |
| 3,662,225 | 5/1972 | Carter et al. | 339/17 M X |
| 3,728,662 | 4/1973 | Puri | 361/391 X |
| 4,017,134 | 4/1977 | Lenglin et al. | 361/390 X |
| 4,247,882 | 1/1981 | Prager et al. | 361/380 |

FOREIGN PATENT DOCUMENTS 7712595 11/1977 Netherlands ..................... 361/380

Primary Examiner—Joseph H. McGlynn
Assistant Examiner—Steven C. Bishop
Attorney, Agent, or Firm—Thomas W. Speckman

[57] ABSTRACT

The invention relates to a rack comprising both in front and in back two vertical angular mounting members which have secured thereto for each card frame two lateral slide assemblies, appropriately oriented with respect to each other, for the adjustable mounting of card frames provided with side plates. These simple and easily installable lateral slides permit the card frames to be adjustably and yet readily detachably secured on the rack, requiring but simple tools for the mounting.

22 Claims, 13 Drawing Figures

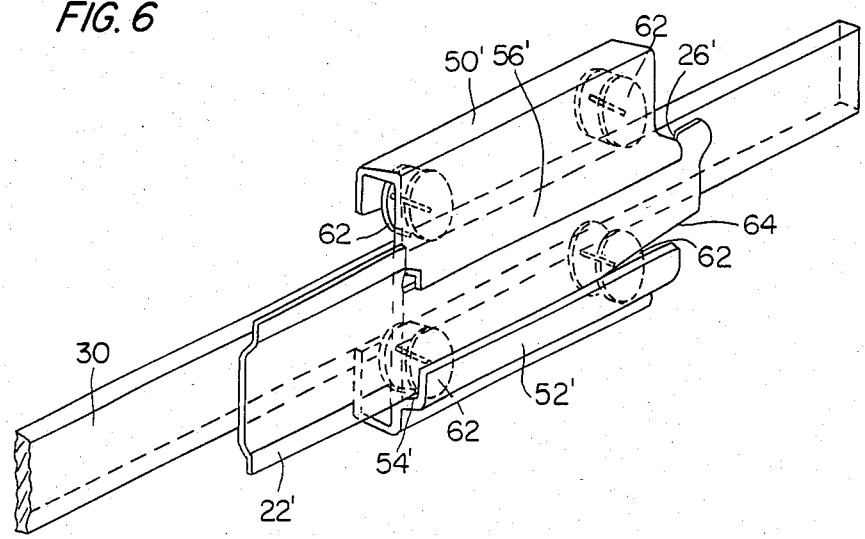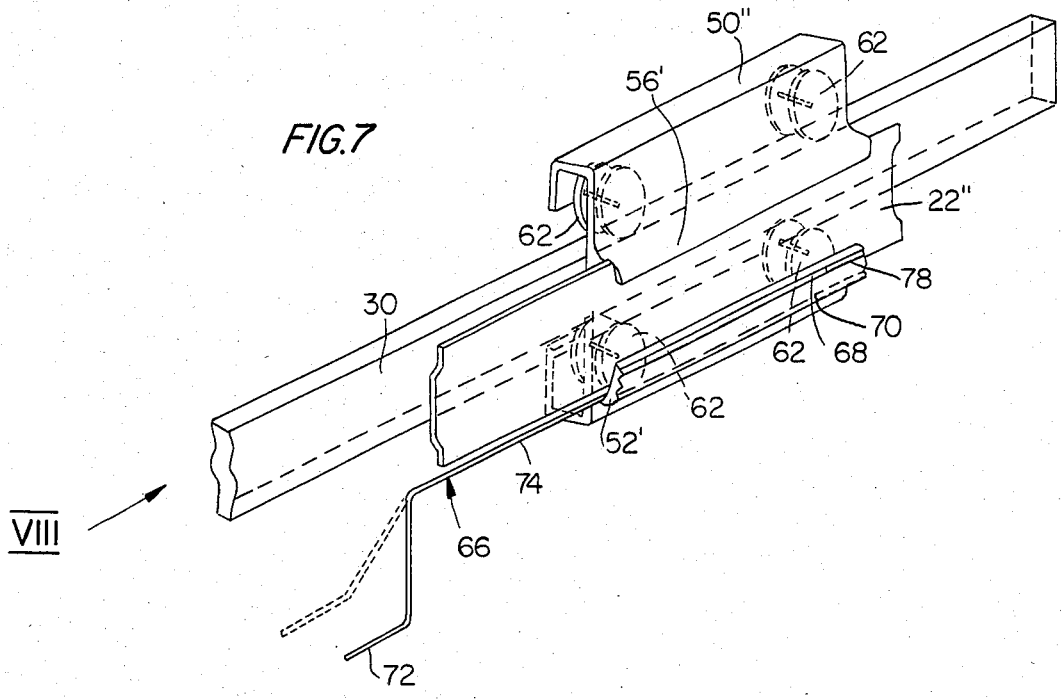

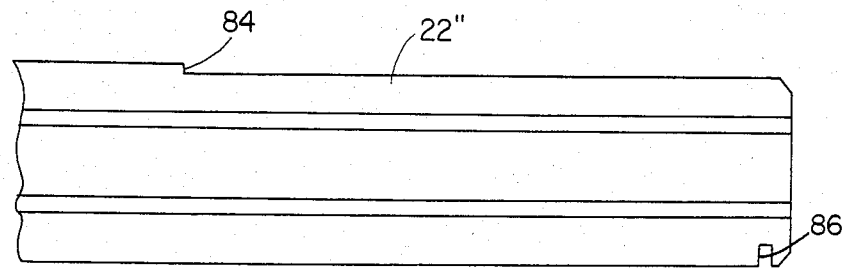
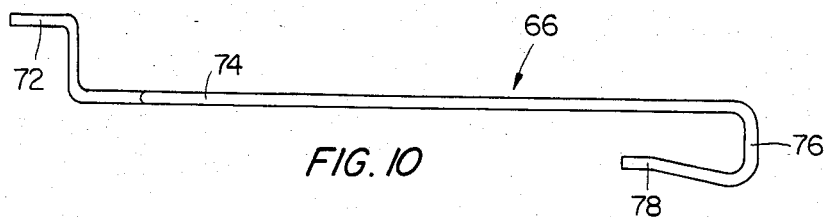
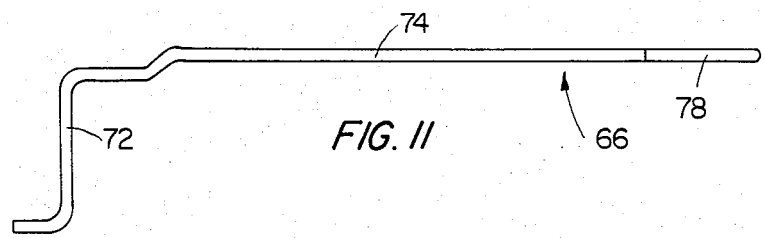
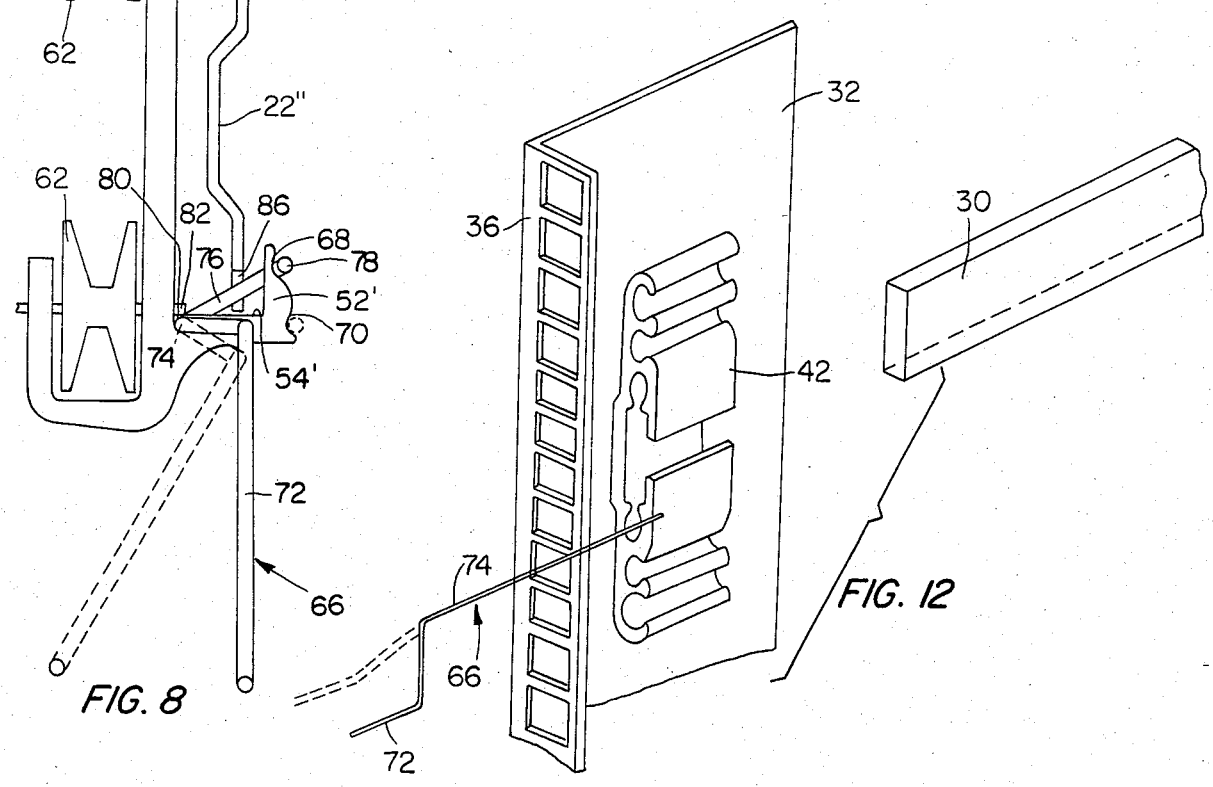

RACK WITH CARD FRAMES ADJUSTABLE ON LATERAL SLIDE GUIDES

BACKGROUND OF THE INVENTION

1. Field of the Invention

This invention relates to a rack comprising two vertical angular mounting members in front and two vertical angular mounting members in back which have secured thereto for each card frame two lateral slides, properly oriented with respect to each other, for the adjustable mounting and guidance of card frames provided with side plates.

2. Description of the Prior Art

In a known rack of this type, the lateral slides are constructed in the form of three-piece telescopic guide arrangements adapted to be locked in their fully extended position by means of latch springs. Before being able to slidably retract the device attached to the sections of the telescopic guides which can be slid out farthest, the latch springs must be manually released. To dismantle the device from the telescopic guides requires a substantial amount of labor.

In the design of lateral slides for the extractable attachment of card frames in racks, two particularly important factors must be taken into consideration. Firstly, since the racks are generally of a standard size and the various standard designs of card frames require a close fit in the racks, the available space is limited. Secondly, since the conceptual design of the card frames is such as to enable the user (e.g. small electronics manufacturers) to assemble and install the card frames, and in view of the possibility that the user may lack the special facilities and tools (e.g. metal working facilities), the slide arrangements should be constructed so that they can be assembled by non-expert labor using simple tools. However, the currently available slide arrangements fail to meet this requirement. They are, as a rule, extremely difficult to install, even for experienced setup personnel, and may require a certain amount of metal working to be performed on the rack and/or on the card frame.

SUMMARY OF THE INVENTION

It is an object of the present invention to provide uncomplicated and easily mountable lateral slides for a rack of the foregoing type to enable the card frames to be detachably and adjustably installed in the rack which is provided with an opening.

This is accomplished according to the present invention in that each lateral slide guiding arrangement comprises a support beam, the ends of which are inserted in receptacles provided by two extrusion moldings which are secured to the respective front angular mounting member and the respective back angular mounting member of the rack; that carriages are adjustably mounted on the support beams which carriages are provided at their confronting inner faces at the bottom with a ledge or lug defining a supporting surface, and at the top they are provided with a projection; that rearwardly projecting cantilever means are provided at the side plates of the card frame, the cantilever means having receptacles at the upper edge of their free ends for interaction with the projections on the carriage; and that the cantilever means are positioned in a slanted condition upon the supporting surfaces and thus are slidably insertable and by lowering the card frame and upon engagement of the projections with the receptacles are secured on the carriage in a horizontally and axially non-displaceable relationship.

Due to this construction, the card frame is capable of being easily detached from the carriages on the lateral slides and just as easily remounted thereon. The operative connection between the cantilevers of the card frame and the carriages is such that it cannot readily inadvertently be disconnected, either completely or partly. Only simple tools are required for the installation of the lateral slides in the rack and the fitting of the cantilevers on the side plates of the card frame, and no additional metal working during the installation is necessary.

According to one embodiment, the mounting of the extrusion moldings for receiving the end portions of the support beams on the angular mounting panels is such that two cylindrical configurations are provided the spacing of which corresponds to the spacing between a series of apertures provided in the leg of the angular mounting panel which forms an inner angle of 90°. The alignment of the fastening screws with the cylindrical spaces in the extrusion moldings is accomplished according to one embodiment of the invention in that the apertures in the legs of the angular mounting panels are rectangular or square in shape, and in that orientation elements having a through bore for the fastening screws are inserted in the apertures and are retained therein in a nonrotatable condition and do not project from the apertures on the side facing the extrusion molding.

The construction of the carriage according to one embodiment of the invention is such that the carriage is C-shaped to form a receptacle that conforms to the cross section of the support beam; that the protuberances and extensions are in the form of confronting L-shaped sections; that the receptacles in the cantilever members take the shape of punched out grooves which accommodate the width of the extensions; and that the distance of the supporting surface of the lug from the horizontal leg of the projection corresponds to the width of the cantilever in the area of the groove bottom of the receptacles.

The stability of the cantilevers is enhanced according to one embodiment in that the longitudinal edges of the cantilevers are bevelled.

The insertion of the cantilevers into the receptacles formed by the protuberances and projections of the carriages is facilitated by making the distance of the vertical legs of the lug and the projection from the opposite wall of the carriage greater than the maximum width of the cantilever.

A space saving connection between the lugs and the side panels of the card frame is obtained according to one embodiment, in that the side panels of the card frame are provided on their inner sides facing each other with shallow channels into which the cantilevers are fitted, and in that the cantilevers fitted in the channels are not allowed to project from the adjacent inner sides of the side panels.

In order to obtain several different ejection paths for the card frame, another embodiment provides for the cantilevers to be connectible in different positions to the side panels of the card frame.

To hold the card frames in their fully inserted position, another embodiment provides for mounting flanges integrally formed on the forward edges of the side panels of the card frame and having fastening holes therein; that the fastening holes are spaced a distance which corresponds to the spacing of additional cylindrical configurations of the extrusion molding member; and that this distance corresponds to the spacing between a series of apertures in the mounting legs of the angular mounting panel.

If according to another embodiment bent springs made of wire or the like are attached to the front ends of the support beams, and such spring is inserted in the receptacle of the associated extrusion molding member and extends part of the length of the end portion of the support beam so that the spring exerts a clamping action on the carriage to retain it in its fully extended position, then also the fully extended position is maintained at a predetermined force.

Another aspect of this invention provides a rack for adjustable mounting of card frames provided with side plates, said rack comprising: two vertical angular mounting members in front and two vertical angular mounting members in back which have secured thereto for each card frame two lateral slide assemblies, oppositely oriented with respect to each other, each said lateral slide assembly comprising a support beam the ends of which are inserted in receptacles provided by two extrusion molded members which are secured to the respective said front and back angular mounting members of said rack; carriages adjustably mounted on each said support beam, said carriages being provided at their confronting inner faces at the bottom with a lug defining a supporting surface and at the upper edge provided with a projection; and a rearwardly projecting cantilever means is provided at each side plate of said card frame, each said cantilever means being capable of being disposed between the lug and projection of the associated carriage and being releasably engageable with the associated carriage.

According to one embodiment, each said cantilever means has a receptacle at the upper edge of each free end for interaction with said projection on said carriage; and said cantilever means are positioned in a tilted condition upon said supporting surfaces and are slidably insertable, and by lowering said card frame and upon engagement of said projections with said receptacles said card frame is secured to said carriage in a horizontally and axially non-displaceable relationship. According to another embodiment, a locking means is fitted to each carriage, the locking means being manually operable to lock the associated cantilever means to the carriage when the cantilever means has been disposed in a predetermined position between the lug and the projection.

BRIEF DESCRIPTION OF THE DRAWINGS

The invention will now be further described, by way of illustrative and non-limiting example, with reference to the accompanying drawings, in which:

FIG. 6 is a perspective view, corresponding to part of FIG. 3B, of a modified carriage and cantilever member;

FIG. 7 is a perspective view, corresponding to FIG. 6, of another modified carriage and cantilever member;

FIG. 8 is an end view of the carriage of FIG. 7, taken in the direction of the arrow VIII in FIG. 7;

FIG. 9 is a side view of the rear end of a cantilever member cooperating with the carriage of FIGS. 7 and 8;

FIG. 10 is a top plan view of a locking spring;

FIG. 11 is a side view of the locking spring of FIG. 9; and

FIG. 12 is a perspective view showing the locking spring relative to the front of the rack.

DESCRIPTION OF PREFERRED EMBODIMENTS

Figure 1:
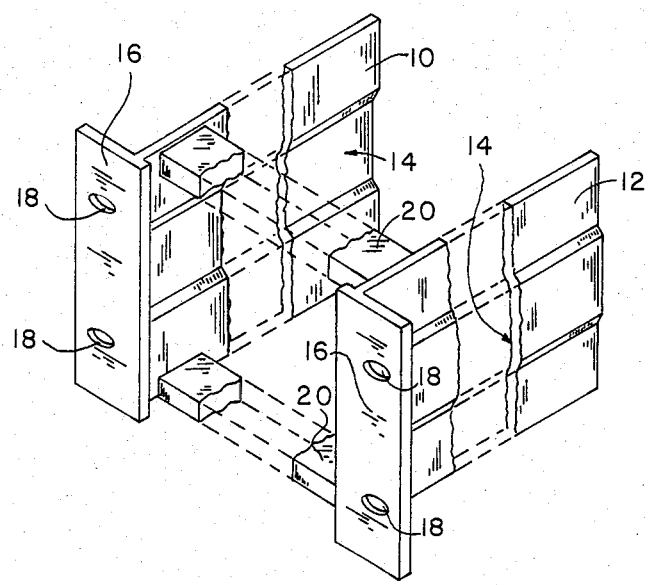
FIG. 1 is a front perspective view of a card frame.

FIG. 1 is a perspective view of a card frame that comprises a left-hand pressure die cast metal side plate 10 and a right-hand pressure die cast metal side plate 12. Side plates 10 and 12 are preferably, though not essentially, of identical construction. Each of the side plates 10 and 12 is so configured as to have an integrally cast shallow channel 14 extending from the front to the rear of the interior surface thereof. Also, each of the side plates 10 and 12 has a front mounting flange 16 cast integrally therewith, the flanges 16 having holes 18 cast therein to enable the card frame to be secured in a rack as described hereinbelow.

Side plates 10 and 12 are disposed in respective vertical planes and are joined together and spaced apart by a plurality of horizontally extending cross rails, only two of which are shown in FIG. 1, the cross rails being secured to side plates 10 and 12 by suitable means (not shown). The illustrated and other cross rails 20 mount various other components of the card frame, for instance card guides for receiving cards and electrical connectors for connection to cards received in the card guides. The card frame illustrated in FIG. 1 may in fact be of generally the same form as that disclosed in our co-pending European Patent Application No. 82303338.6 (Publication No. EP 0 068 850A).

A slide arrangement enabling the card frame of FIG. 1 to be releasably slidably fitted within a rack will be described with reference to FIGS. 2 to 5.

Figure 2:
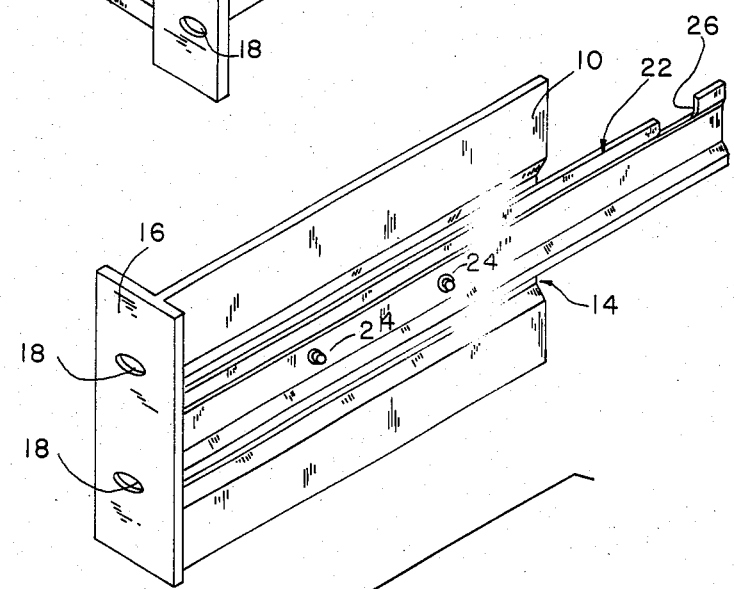
FIG. 2 is a front perspective view of one of a pair of side plates of the card frame of FIG. 1 with a cantilever member secured thereto.

As shown in FIG. 2, cantilever member 22 is fitted within channel 14 in the interior surface of left-hand side plate 10 by means of screws 24 or the like that are passed through holes in side plate 10. Member 22 is formed from sheet steel that may be corrugated along its edges to enhance its strength. By virtue of the presence of channel 14, the interior surface of member 22 does not project beyond the plane defining those parts of the interior surface of side plate 10 above and below channel 14. This feature therefore makes very efficient use of space, though (with less efficient use of space) member 22 could instead be fitted to the exterior of side plate 10 or could be fitted to the interior (or exterior) of other forms of a side plate not having channel 14. As can further be seen from FIG. 2, cantilever member 22 projects some way behind the rear of side plate 10 and has recess or cut-out 26 in its upper edge towards its free end.

A similar cantilever member is fitted within recess 14 in the interior surface of right-hand side plate 12. Since the other cantilever member and its mode of fitting are in substance the same as those of illustrated member 22, they will not be described in any detail.

Figure 3A:
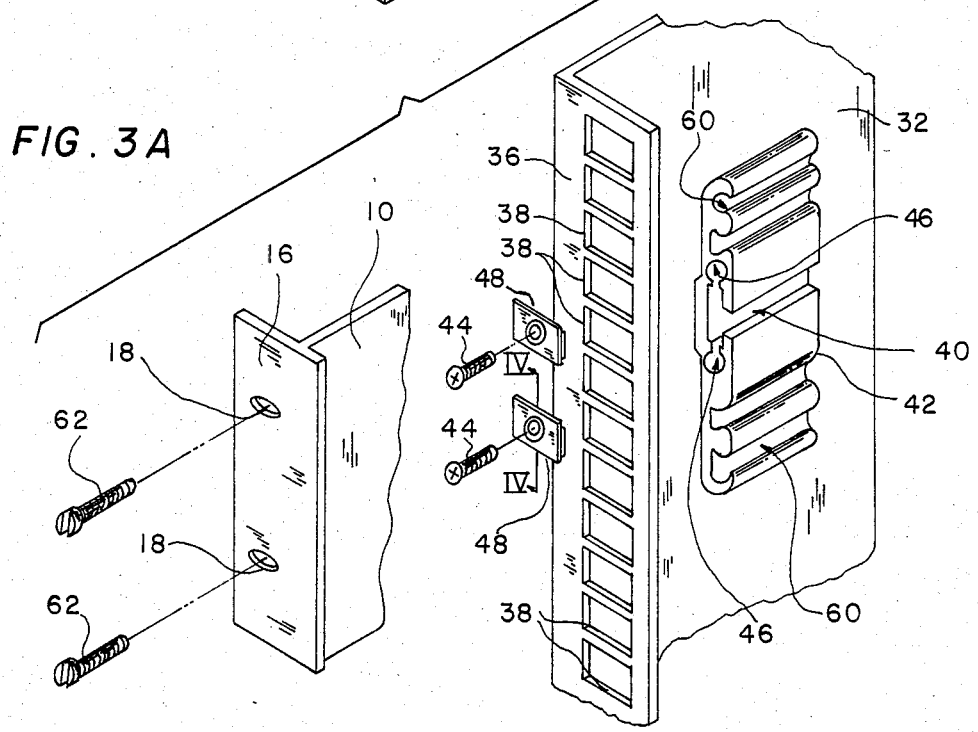
FIGS. 3A and 3B jointly form an exploded front perspective view of part of a slide arrangement for fitting the card frame in a rack.
Figure 3B:
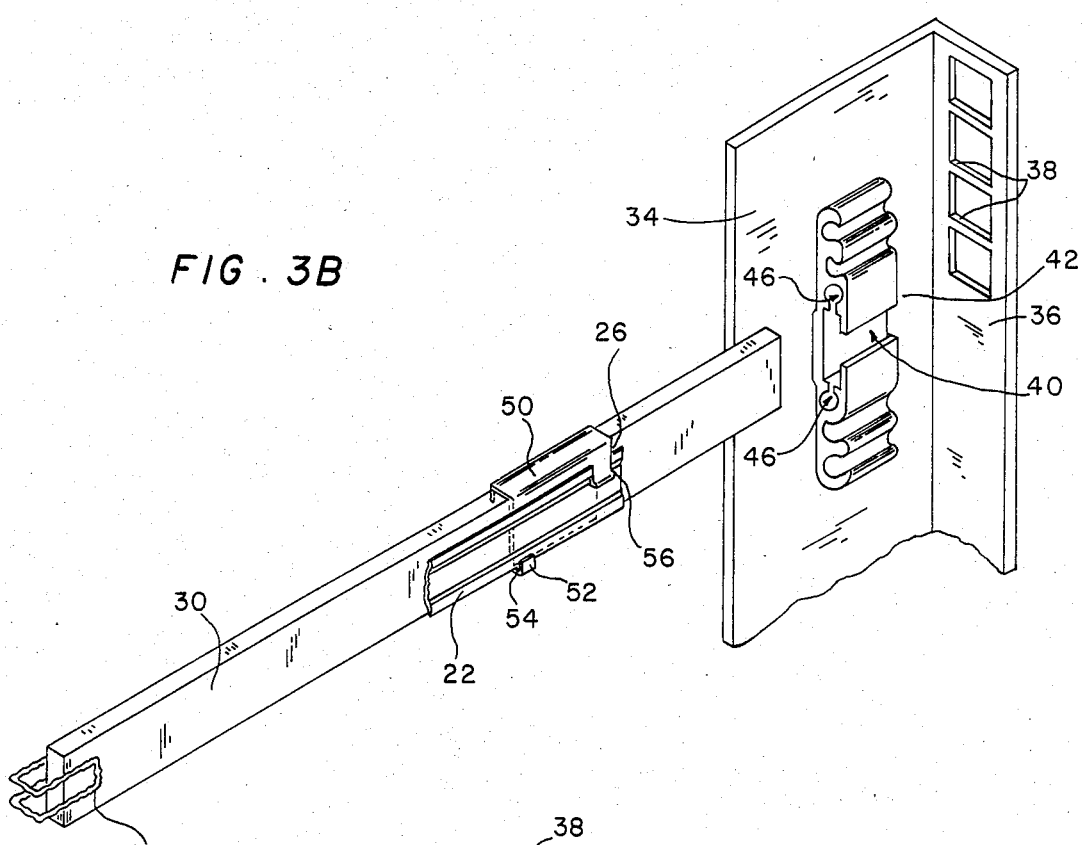

The slide arrangement further comprises a pair of steel beams fitted inside opposite sides of a rack to extend from the front to rear of respective sides thereof. One such beam 30, for association as described below with cantilever member 22 shown in FIG. 2, is shown in FIG. 3B. The manner of its mounting will now be described with reference to FIGS. 3A and 3B. The other beam and its manner of mounting are substantially the same whereby they will not be described.

Figure 4:
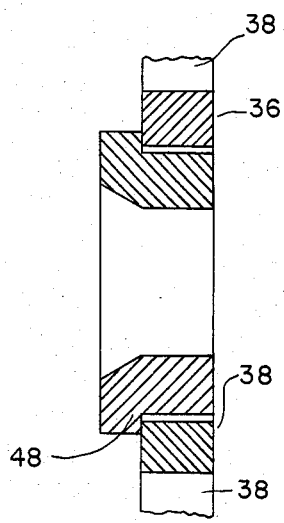
FIG. 4 is a cross-sectional view (on a larger scale) of an orientation member, taken along a line IV—IV in FIG. 3A, showing the member disposed in an aperture in a front mounting angle of the rack.
Figure 5:
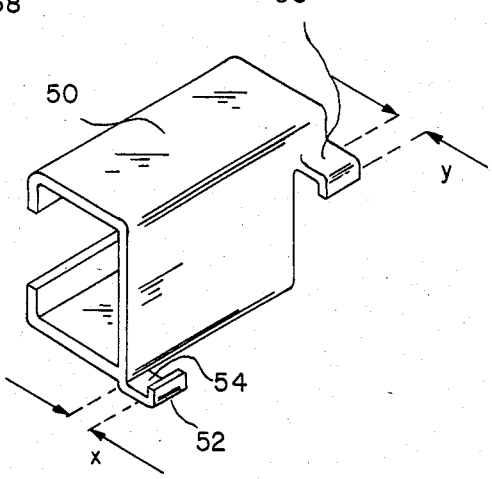
FIG. 5 is a perspective view on a larger scale of a carriage shown in FIG. 3B.

The rack is of a standard construction and is provided at its front and rear with mounting angle members 32, 34, each of which comprises a part 36 extending inwardly from the associated side of the rack at right angles thereto and is provided with a column of rectangular (i.e. square or oblong) apertures 38 spaced at equal spacings. Each end of beam 30 is received within recess 40 of complementary configuration in extrusion 42. Extrusions 42 are secured to and are in direct abutment with the interior faces of parts 36 of mounting angles 32 and 34 by virute of screws 44 that extend through associated apertures 38, and into cylindrical configurations 46 in extrusions 42, via orientation elements 48 (FIGS. 3A and 4). As will be seen, orientation elements 48 are of complementary configuration to apertures 38 and fit therein so as not to extend behind the rear ends thereof, elements 48 thus in effect "converting" associated rectangular apertures 38 into guide holes for the screws 44. Circular configurations 46 can be tapped. Preferably, however, they are non-tapped, the screws 44 being self-tapping.

Carriage 50 (FIGS. 3B and 5), which is preferably a machined extrusion but may instead be a metal casting, is slidably received on beam 30 as shown in FIG. 3B. (A similar carriage (not shown) is fitted on the other beam in a similar manner). Lug 52 disposed at the bottom of carriage 50 towards its front end defines support surface 54. Carriage 50 is provided with projection 56 at its rear end and towards its upper edge.

A "crinkled" spring 60 (FIG. 3B) of wire or the like is positioned as shown over the front end of beam 30 before that end of the beam is received in recess 40 in front extrusion 42 whereby, on assembly, part of the spring extends outside of recess 40 along a small portion of the length of beam 30 adjacent its front end. A similar spring (not shown) is provided on the front end of the other beam.

The card frame is fitted in the rack in the following manner. Firstly, carriages 50 are slid towards the front of the rack. Springs 60 are urged inside carriages 50 as they reach the front of the rack, which provides a force tending to restrain the carriages against rearward sliding movement, which force can however be overcome by moderate pressure once the card frame has been fitted to the carriages. The card frame is held with its front tilted upwardly such that the rearwardly extending portions of cantilever members 22 are inclined somewhat above beams 30. The lower edges of cantilever members 22 are then engaged with support surfaces 54 and slid some way into the rack along surfaces 54. The card frame is then lowered, whereby cantilever members 22 tend to pivot about support surfaces 54, and the card frame is manipulated until projections 56 extend (as shown in FIG. 3B) into recesses 26. The card frame is then released and its weight is taken by support surfaces 54 and projections 56. The card frame can then be slid into the rack by pushing it inwardly, the interengagement of projections 56 and recesses 26 preventing relative movement of members 22 and carriage 50 axially of beams 30 whereby the card frame slides in with carriages 50. As will be appreciated, the interengaged projections 56 and recesses 26 prevent separation of the card frame from carriages 50 by the forces normally involved in sliding the card frame into and out of the rack. To remove the card frame, it is necessary to slide it out of the rack and lift it to disengage projections 56 and recesses 26, whereupon it can be lifted out at an upwardly inclined angle.

The widths of support surface 54 and projection 56 (the dimensions x and y in FIG. 5) of each carriage 50 are preferably considerably greater than the width of the associated cantilever member 22. This provides a lateral tolerance that greatly increases the facility with which cantilever members 22 can be engaged with carriages 50.

Extrusions 42 are provided with other cylindrical configurations than the configurations 46. Two of the further cylindrical configurations in front extrusions 42, namely those referenced 60 in FIG. 3A, can be used in place of the cage nuts conventionally employed to receive screws 62 (FIG. 3A) passed through holes 18 in front mounting flanges 16 to hold the card frame in place in the rack. If, as is the case with some racks of larger depth, further holes are provided in flanges 16, screws can be passed through these into cage nuts fitted in conventional manner into other apertures 38.

FIG. 6 shows two modifications, either one of which or both of which may be made in the arrangement described with reference to FIGS. 1 to 5.

Housed within the carriage 50' of FIG. 6 are rolling elements in the form of upper and lower pairs of wheels or rollers 62 that roll on the upper and lower faces of the beam 30 to facilitate sliding of the carriage along the beam.

The lug 52 is replaced by a lug 52' (having a support surface 54') that extends along the whole of the length of the carriage 50'. The projection 56 is similarly replaced by a projection 56' that extends along the whole of the length of the carriage 50', and the cut-out or recess 26 in the cantilever member (22') is replaced by a longer cut-out or recess 26' that will accommodate the projection 56'. The cantilevers 22' are fitted into the carriages 50' as described above. However, to enable fitment and removal to take place without interference between the cantilever members 22' and the lugs 52', the lower rear ends 64 of the cantilever members are tapered or otherwise cut away.

As explained above, the card frames described above can be disengaged from the carriages simply by lifting them and sliding them out. A disadvantage of such an arrangement is that a user may unintentionally lift the card frame while pulling it out from the rack and may thus unintentionally disengage the card frame from the rack. FIG. 7 shows a modified cantilever member 22" and carriage 50" designed to prevent unintentional removal of the card frame (i.e. unintentional disengagement of the cantilever member 22" from the carriage 50") by providing manually operable means for locking the cantilever member 22" and carriage together.

The carriage 50" of FIGS. 7 and 8 is similar to the carriage 50' of FIG. 6, except for the mounting thereto of a locking spring 66 and the provision of a pair of retaining grooves 68, 70 at least at the rear end of the outer face of the lugs 52'.

The locking spring 66 is an elongate, resilient rod-like or wire-like member comprising a crank portion 72, a body portion 74, a locking portion 76 and a retaining portion 78. The body portion 74 rests in a groove 80 (FIG. 8) in the support surface 54' and is prevented from emerging therefrom by any suitable means, for example by the spindles 82 (FIG. 8) of the lower wheels or rollers 62. The spring 66 can be rotated about the axis of the body portion 74, by means of the crank portion 72, between a locking position (shown in full lines) and a non-locking position (shown in dotted lines). The spring 66 is stable in the locking and non-locking positions by virtue of the retaining portion being disposed in the grooves 68 and 70, respectively. Slight deformation of the spring 66 is necessary to move it between the two positions, whereby it is a "snap-fit" in the two positions.

The cantilever member 22" for cooperation with the carriage 50" is shown in FIG. 9. It has a shoulder or lip 84 on its upper edge and a cut-out 86 in its lower edge.

The card frame is fitted into the rack in the following manner. It is assumed that the carriages 50" are at the front of the rack and the springs 66 are in the non-locking positions. The card frame is positioned so that the lower edges of the cantilever members 22" are engaged with the support surfaces 54' and the cantilever members are slid rearwardly into the carriages 50". (In contrast to the arrangements of FIGS. 1 to 6, no tilting or inclination of the cantilever members with respect to the carriages is necessary in this case). Any tendency of the carriages 50" to slide rearwardly along the beams 30 is limited by abutment of the crank portion 72 of the spring 66 with the part 36 of the rack slide plate 32. The rearward movement is continued until the lips 84 on the cantilevers abut the carriages 50", in which position the cut-out 86 in each cantilever member is aligned with the locking portion 76 of the spring 66, and the spring 66 is then rotated (by means of the crank 72) into the locking position in which position the locking portion 76 enters the cut-out 86 and locks the cantilever member to the carriage. The card frame can then be slid rearwardly into the rack. To remove the card frame from the rack, the foregoing process is repeated in reverse order.

The slide arrangements described above are easy to fit, installation normally requiring no drilling or other metal working operations. Thus, cantilever members 22, 22', 22" can be fitted to side plates 10 and 12 with ease using holes already therein. Fitting beams 30 in the rack is a matter of great simplicity, requiring only the operation of a screwdriver from outside of the rack. Further, the engagement of the card frame into the carriages is a matter of considerable simplicity, as will be apparent from the foregoing description of the arrangements.

The arrangements also have the following further advantages. Although cantilever members 22, 22', 22" are designed to cooperate with a particular design of rack having side plates 10 and 12 with internal channels 14, they can, as mentioned above, be fitted to other designs of a sub-rack or card frame, though some drilling of the side plates may be required. A second advantage of the arrangements described above is that the only alteration required to adapt the arrangements for racks of differing depth is in the length of beams 30. Thus, simply supplying a range of different lengths of beam enables a supplier to provide a range of slide arrangements for use with different depths of rack. Furthermore, it will be possible to use a slide arrangement with a non-standard depth rack by selecting the next longest size of beam and cutting it to length. A further advantage is that, by providing a series of mounting holes for cantilever members 22, 22', 22" on side plates 10 and 12, the cantilever members can be moved to extend further from the back of the card frame if it is required that the degree of projection of the card frame from the rack, when slid out, be increased.

As mentioned above, the slide arrangements described with reference to the drawings are particularly designed to provide for the releasable slidable fitting of a card frame within a rack. However, the invention has more general applicability. The arrangements described above could be modified to mount other objects within a rack, card frames within other housings, or other objects within other housings.

We claim:

1. A rack for adjustable mounting of card frames provided with side plates, said rack comprising: two vertical angular mounting members in front and two vertical angular mounting members in back which have secured thereto for each card frame two lateral slide assemblies, oppositely oriented with respect to each other, each said lateral slide assembly comprising a support beam (30) the ends of which are inserted in receptacles (40) provided in each of two receptacle members (42) which are secured to the respective said front and back angular mounting members (32, 34) of said rack; a carriage (50, 50') adjustably mounted on each said support beam, each said carriage being provided at its inner faces with an extending lower projection (52, 52') defining a supporting surface (54, 54') and with an extending upper projection (56, 56'); a rearwardly projecting cantilevr means (22, 22') is provided at each side plate (10, 12) of said card frame, said cantilever means (22, 22') having a recess (26, 26') on the upper edge of each free end for connection with said projection (56, 56') on said carriage (50, 50'); and said cantilever means (22, 22') when positioned in a tilted condition upon said supporting surfaces (54, 54') are slidably insertable, and by lowering said card frame engagement of said projections (56, 56') with said recesses (26, 26') is obtained and said card frame is secured to said carriage (50, 50') in a horizontally and axially non-displaceable relationship.

2. A rack according to claim 1, wherein said receptacle members (42) are provided with two cylindrical configurations (46) the spacing of which corresponds to spacing of equally spaced multiple apertures (38) provided in legs (36) forming an inner angle of 90° with said angular mounting members (32, 34).

3. A rack according to claim 2, wherein said apertures (38) in said legs (36) of said angular mounting members (32, 34) are rectangular in shape, and have orientation elements (48) having a through bore for receiving fastening screws (44), said orientation elements being retained in said apertures (38) in a non-rotatable condition and do not project from said apertures (38) on the sides facing said receptacle members (42).

4. A rack according to claim 3, wherein said carriages (50, 50') are C-shaped and mount over said support beams (30), said lower projections (52, 52') and said upper projections (56, 56') are in the form of confronting L-shaped sections, said recesses (26, 26') in said cantilever means (22, 22') are the shape of punched out grooves which accommodate the length of said upper projections (56, 56'), and the width of said supporting surface (54, 54') of said lower projections (52, 52') from the horizontal leg of said upper projection (56, 56') is greater than the width of said cantilever means (22, 22').

5. A rack according to claim 4, wherein the longitudinal edges of said cantilever means (22, 22') are bevelled.

6. A rack according to claim 5, wherein the distance of the vertical legs of said lower projections (52, 52') and said upper projections (56, 56') from the opposite wall of said carriage (50, 50') is greater than the maximum width of said cantilever means (22, 22').

7. A rack according to claim 6, wherein said side plates (10, 12) of said card frame are provided on their inner sides facing each other with shallow channels (14) into which said cantilever means (22, 22') are fitted.

8. A rack according to claim 7, wherein said cantilever means (22, 22') fitted in said channels (14) are of a length so as not to project from the adjacent inner sides of said side plates (10, 12).

9. A rack according to claim 8, wherein said cantilever means (22, 22') are connectible in different positions to said side plates (10, 12) of said card frame.

10. A rack according to claim 7, wherein said cantilever means (22, 22') are connectible in different positions to said side plates (10, 12) of said card frame.

11. A rack according to claim 9, wherein mounting flanges (16) are formed on the forward edges of said side plates (10, 12) of said card frame having fastening holes (18) therein, said fastening holes (18) are spaced a distance which corresponds to the spacing of additional cylindrical configurations (60) in said receptacle members (42), and said distance corresponds to spacing of equally spaced multiple apertures (38) provided in mounting legs (36) of said angular mounting panels (32, 34).

12. A rack according to claim 10, wherein the forward end of said support beam (30) has a flexed spring (60) attached thereto, said spring (60) being inserted in said receptacle (40) of the associated said receptacle member (42) and extends part of the length of the end portion of said support beam (30) so that said spring (60) exerts a clamping action on said carriage (50) to retain it in its fully extended position.

13. A rack according to claim 1, wherein said carriages (50, 50') are C-shaped and mount over said support beams (30, 30'), said lower projections (52, 52') and said upper projections (56, 56') are in the form of confronting L-shaped sections, said recesses (26, 26') in said cantilever means (22, 22') are the shape of punched out grooves which accommodate the length of said upper projections (56, 56'), and the distance of said supporting surface (54, 54') of said lower projections (52, 54') from the horizontal leg of said cantilever means (22, 22') in the area of the groove bottom of said receptacles (26, 26').

14. A rack according to claim 1, wherein the longitudinal edges of said cantilever means (22, 22') are bevelled.

15. A rack according to claim 1, wherein the distance of the vertical legs of said lower projections (52, 52') and said upper projections (56, 56') from the opposite wall of said carriage (50, 50') is greater than the maximum width of said cantilever means (22, 22').

16. A rack according to claim 1, wherein said side plates (10, 12) of said card frame are provided on their inner sides facing each other with shallow channels (14) into which said cantilever means (22, 22') are fitted.

17. A rack according to claim 1, wherein mounting flanges (16) are formed on the forward edges of said side plates (10, 12) of said card frame having fastening holes (28) therein, said fastening holes (18) are spaced a distance which corresponds to the spacing of additional cylindrical configurations (60) in said receptacle members (42), and said distance corresponds to spacing of equally spaced multiple apertures (38) provided in mounting legs (36) of said angular mounting panels (32, 34).

18. A rack according to claim 1, wherein the forward end of said support beam (30) has a flexed spring (60) attached thereto, said spring (60) being inserted in said receptacle (40) of the associated said receptacle member (42) and extends part of the length of the end portion of said support beam (30) so that said spring (60) exerts a clamping action on said carriage (50) to retain it in its fully extended position.

19. A rack according to claim 1, wherein said carriages (50, 50') are provided with upper and lower roller means (62) rollably engaging said support beams (30).

20. A rack for adjustable mounting of card frames provided with side plates, said rack comprising: two vertical angular mounting members in front and two vertical angular mounting members in back which have secured thereto for each card frame two lateral slide assemblies, oppositely oriented with respect to each other, each said lateral slide assembly comprising a support beam (30) the ends of which are inserted in receptacles (40) provided in each of two receptacle members (42) which are secured to the respective said front and back angular mounting members (32, 34) of said rack; a carriage (50, 50', 50") adjustably mounted on each said support beam, each said carriages being provided at their confronting inner faces with an extending lower projection (52, 52') defining a supporting surface (54, 54') and provided with an extending upper projections (56, 56'); and a rearwardly projecting cantilever means (22, 22', 22") is provided at each side plate (10, 12) of said card frame, each said cantilever means (22, 22', 22") being capable of being disposed between said extending lower projections (52, 52', 52") and said extending upper projection (56, 56', 56") of the associated carriage (50, 50', 50") and being releasably engageable with the associated carriage.

21. A rack according to claim 20, wherein a locking means (66) is fitted to each said carriage (50"), said locking means manually operable to lock the associated said cantilever means (22") to said carriage (50") when said cantilever means has been disposed in a predetermined position between said extending lower projection (52") and said extending upper projection (56").

22. A rack according to claim 20, wherein said carriages (50, 50', 50") are provided with upper and lower roller means (62) rollably engaging said support beams (30).

* * * * *